United States Patent
Ramanathan et al.

(10) Patent No.: US 7,118,989 B2
(45) Date of Patent: Oct. 10, 2006

(54) METHOD OF FORMING VIAS ON A WAFER STACK USING LASER ABLATION

(75) Inventors: Shriram Ramanathan, Portland, OR (US); Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 10/922,708

(22) Filed: Aug. 20, 2004

(65) Prior Publication Data

US 2006/0040471 A1    Feb. 23, 2006

(51) Int. Cl.
*H01L 21/46* (2006.01)

(52) U.S. Cl. .................. 438/455; 438/459; 438/460; 257/E21.088

(58) Field of Classification Search ............... 438/455
See application file for complete search history.

(56) References Cited

U.S. PATENT DOCUMENTS 6,333,485 B1 * 12/2001 Haight et al. .......... 219/121.68
6,738,396 B1 * 5/2004 Filgas et al. ................ 372/19
2003/0232486 A1 * 12/2003 Mashino ................... 438/455

OTHER PUBLICATIONS

V. Mizeikis et al., "Silicon Surface Processing Techniques for Micro-System Fabrication", Thin Solid Films 438-439, pp. 445-451 (2003).

X. Liu, "Submicron Lines on Thin Metal Films Micromachined by an Ultrafast Laser Osillator", Lasers and Electro-Optics, CLEO '98, Technical Digest (May 1998).

Dr. P. Bado et al., Micromachining Handbook, Ver. 2.3, CLark-MXR, Inc. (2001), available at "http://www.cmxr.com/Industrial/Handbook/Index/htm".

* cited by examiner

*Primary Examiner*—Asok Kumar Sarkar
(74) *Attorney, Agent, or Firm*—Kerry D. Tweet

(57) ABSTRACT

Disclosed are various embodiments of a method of forming vias for backside connections in a wafer stack, wherein the vias are formed by non-thermal laser ablation. Other embodiments are described an claimed.

7 Claims, 7 Drawing Sheets

METHOD OF FORMING VIAS ON A WAFER STACK USING LASER ABLATION

FIELD OF THE INVENTION

The invention relates generally to wafer bonding and, more particularly, to a method of forming vias for backside connections on a wafer stack using laser ablation.

BACKGROUND OF THE INVENTION

Wafer bonding is the joining together of two or more semiconductor wafers upon which integrated circuitry has been formed to form a three-dimensional wafer stack. The wafer stack is subsequently diced into separate "stacked die," each stacked die having multiple layers of integrated circuitry. Wafer stacking technology offers a number of potential benefits, including improved form factors, lower costs, enhanced performance, and greater integration through "system-on-chip" solutions. Potential applications for wafer stacking technology include, for example, high performance processing devices, video and graphics processors, as well as high density and high bandwidth memory chips.

Typically, to form a wafer stack, two wafers are oriented in face-to-face relationship, and conductors on one wafer are bonded to conductors on the other wafer. Each of the wafers—and, hence, the wafer stack—includes integrated circuitry for a number of integrated circuit die, or stacked die, which will ultimately be cut from the wafer stack. Electrical connections are formed through the backside of one of the wafers, and these backside connections will provide for the electrical connection of each stacked die with a next-level component, such as a package substrate, a circuit board, a motherboard, another integrated circuit device, a computer system, etc. The backside connections may comprise a number of conductive vias formed through one of the wafers, each via having one end extending to a conductor in the wafer (e.g., a conductor within an interconnect structure formed on that wafer) and having an opposing end coupled with a lead. For a flip-chip type package employing Controlled Collapse Chip Connection ("C4") assembly techniques, these leads may comprise an array of solder bumps (or columns or other conductive elements).

The vias used to form the backside connections on a wafer stack, as described above, may be formed by a dry etch process (e.g., plasma etching). With these etching processes, however, it may be difficult to form vias having a high aspect ratio, which can limit the thickness of a wafer that can be etched through. Additional limitations on this technique of forming vias for backside connections include a lack of selectivity and the potential for overetching and/or an undesirable etch profile, as well as a sensitivity to variations in thickness of the wafer (which may be thinned at the backside).

DETAILED DESCRIPTION OF THE INVENTION

Disclosed are embodiments of a method of forming backside connections on a wafer stack, as well as embodiments of a method of forming vias for such connections using a laser ablation process. According to one embodiment, a laser providing femtosecond laser pulses is used to create a via by laser ablation. In another embodiment, the laser ablation process is substantially non-thermal (e.g., minimal to no heat generation). In a further embodiment, by choosing the appropriate ablation threshold, the laser ablation process is selective, such that an underlying layer (e.g., a conductor) can serve as a natural "etch stop." According to yet another embodiment, the diameter of a via can be controlled by adjusting the power density distribution of the laser beam.

Figure 1:
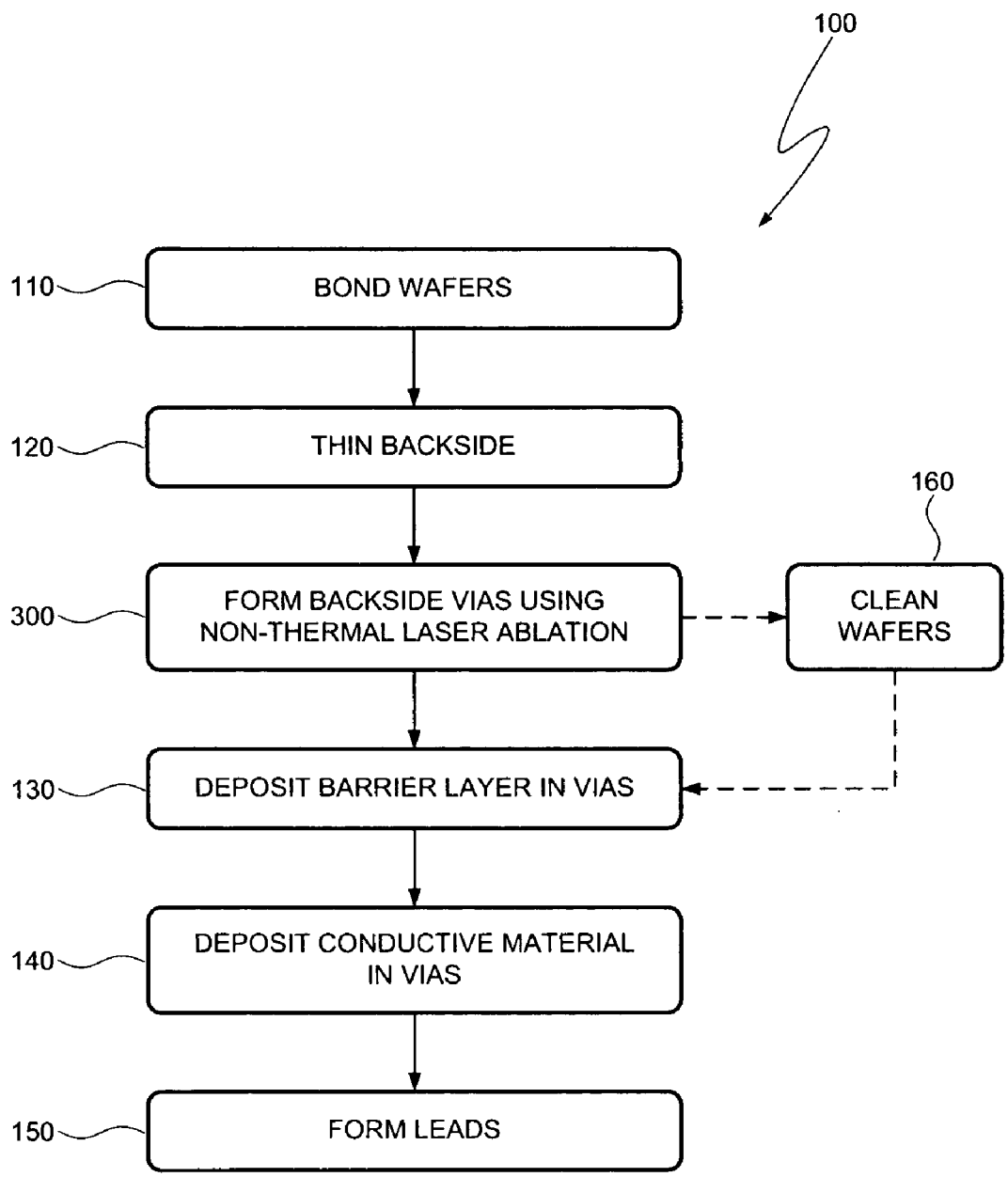
FIG. 1 is a block diagram illustrating an embodiment of a method of forming backside connections on a wafer stack.

Turning now to FIG. 1, illustrated is an embodiment of a method 100 of forming backside connections on a wafer stack. Embodiments of the method 100 shown in FIG. 1 are further illustrated in the schematic diagrams of FIGS. 2A through 2G, and reference should be made to these figures as called out in the text.

Figure 2A:
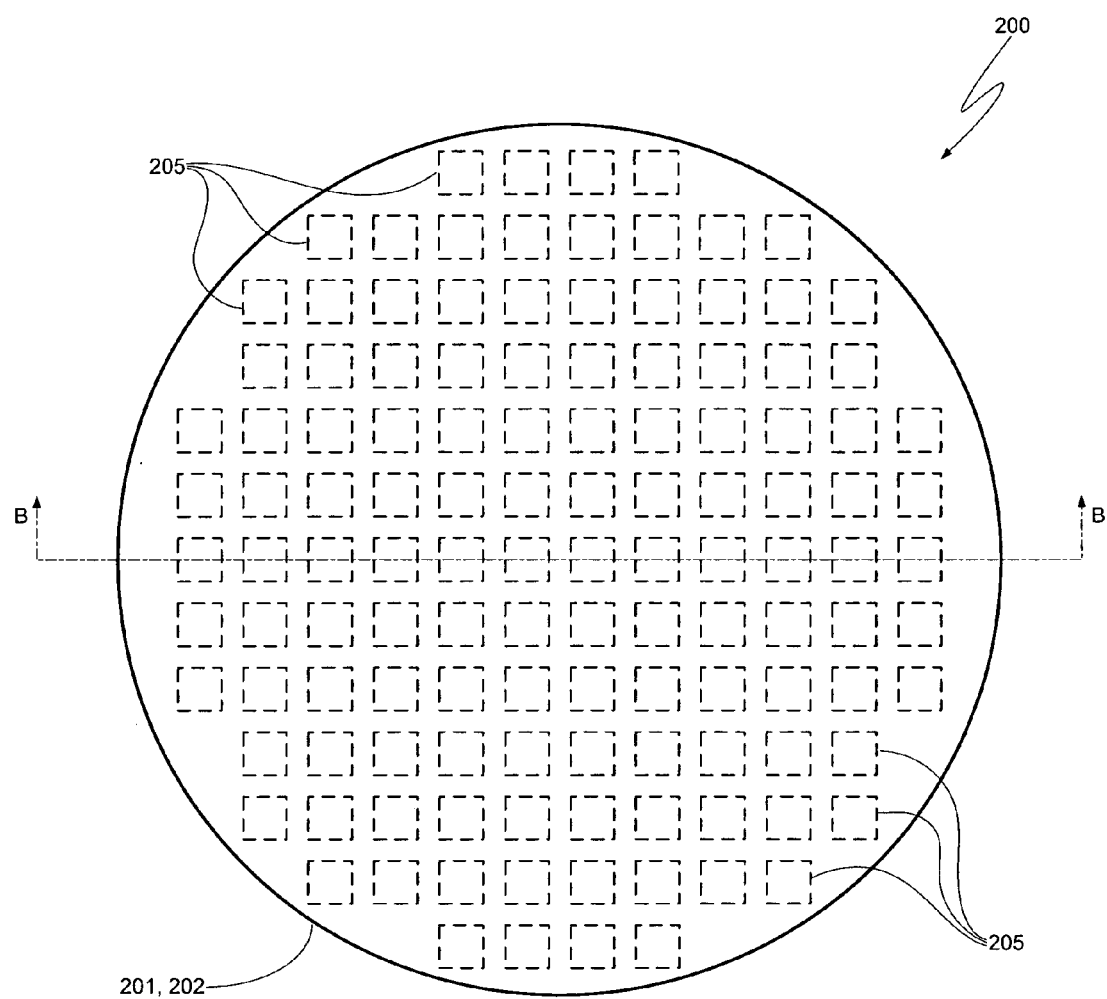
FIGS. 2A–2G are schematic diagrams further illustrating the method of forming vias shown in FIG. 1.
Figure 2B:
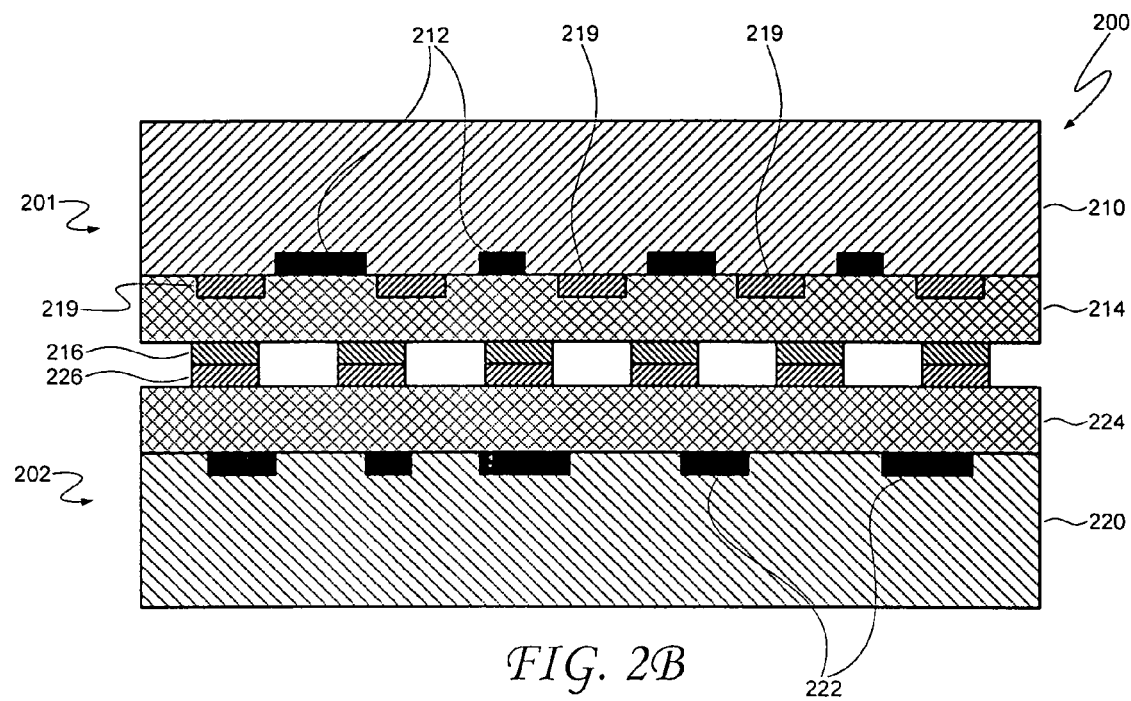

Referring first to block 110, two (or more) wafers are bonded together. This is illustrated in FIGS. 2A and 2B, wherein FIG. 2B shows a cross-sectional view of the wafer stack of FIG. 2A, as taken along line B—B of FIG. 2A. Referring to these figures, a wafer stack 200 includes a first wafer 201 and a second wafer 202, each of the wafers 201, 202 comprising a substrate 210, 220, respectively. The substrate 210, 220 of each wafer 201, 202 typically comprises a semiconductor material, such as Silicon (Si), Silicon-on-Insulator (SOI), Gallium Arsenide (GaAs), etc. Integrated circuitry for a number of stacked die 205 has been formed on each of the wafers 201, 202, and the wafer stack 200 is ultimately cut into these separate stacked die 205. The integrated circuitry for each stacked die 205 may include a number of active devices 212 (e.g., transistors, capacitors, etc.) formed on the substrate 210 of first wafer 201 and a number of active devices 222 formed on the substrate 220 of second wafer 202.

Disposed over a surface of first wafer 201 is an interconnect structure 214, and disposed over a surface of the second wafer 202 is an interconnect structure 224. Generally, each of the interconnect structures 214, 224 comprises a number of levels of metallization, each layer of metallization separated from adjacent levels by a layer of dielectric material (or other insulating material) and interconnected with the adjacent levels by vias. The dielectric layers of interconnects 214, 224 are often each referred to as an "interlayer dielectric" (or "ILD"), and the ILD layers may comprise any suitable insulating material, such as $SiO_2$, $Si_3N_4$, Carbon-doped Oxide (CDO), SiOF, or a spun-on material (e.g., a spun-on glass or polymer). The metallization on each layer comprises a number of conductors (e.g., traces) that may route signal, power, and ground lines to and from the integrated circuitry of each die 205, and this metallization comprises a conductive material, such as Copper, Aluminum, Silver, Gold, as well as alloys of these (or other) materials. These conductors may, for example, include conductors 219 in the interconnect structure 214 of first wafer 201.

Formed on an uppermost ILD layer of interconnect structure 214 of first wafer 201 are conductors 216. Similarly, formed on an uppermost ILD layer of interconnect structure 224 of second wafer 202 are conductors 226. According to one embodiment, the first and second wafers 201, 202 are bonded together by metal-to-metal bonds (e.g., Copper-to-Copper bonds) between the conductors 216, 226 on their uppermost interconnect layers, respectively. These metal-to-metal bonds may be formed using any suitable technique, such as diffusion bonding or a reflow process. It should be understood, however, that the first and second wafers 201, 202 may be aligned and bonded together using any suitable bonding apparatus and using any other suitable joining process (e.g., adhesive bonding).

In one embodiment, the first and second wafers 201, 202 have the same size and shape; however, in another embodiment, these wafers have differing shapes and/or sizes. In one embodiment, the first and second wafers 201, 202 comprise the same material, and in a further embodiment, the first and second wafers 201, 202 comprise different materials. Also, although the wafers 201, 202 may be fabricated using substantially the same process flow, in another embodiment, the wafers 201, 202 are fabricated using different process flows. In one embodiment, one of the wafers (e.g., wafer 201) includes logic circuitry formed using a first process flow, and the other wafer (e.g., wafer 202) includes memory circuitry (e.g., DRAM, SRAM, etc.) that is formed using a second, different process flow. Thus, as will be appreciated by those of ordinary skill in the art, the disclosed embodiments are applicable to any type of wafer or combination of wafers—irrespective of size, shape, material, architecture, and/or process flow—and, as used herein, the term "wafer" should not be limited in scope to any particular type of wafer or wafer combination.

Ultimately, the wafer stack 200 will be cut into a number of separate stacked die 205, as noted above. To couple each stacked die with a next-level component (e.g., a package substrate, a circuit board, a motherboard, another integrated circuit device, a computer system, etc.), a number of backside connections are provided for each die. For a flip-chip type package—employing, for example, C4 assembly techniques—these backside connections may include a number of leads comprising an array of solder bumps (or columns). The array of solder bumps is electrically coupled with a mating array of leads (e.g., lands, pads, etc.) formed on the next-level component. Formation of the backside connections is described below in greater detail.

Figure 2C:
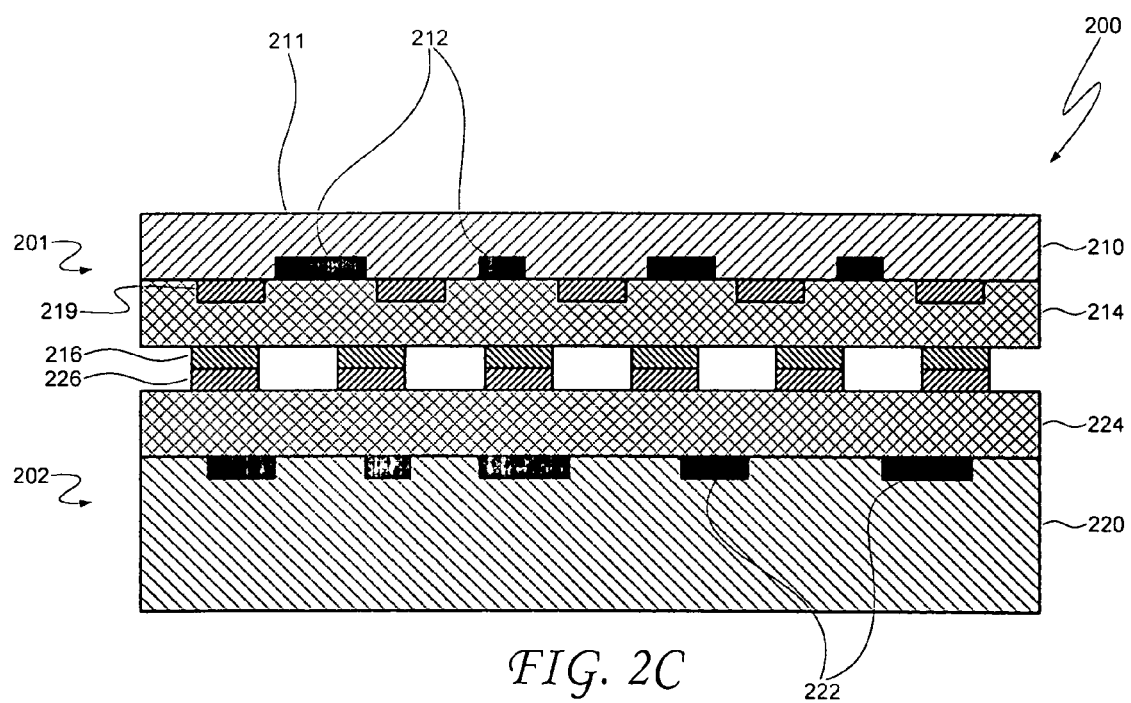

Returning to FIG. 1, and block 120 in particular, the backside of one of the wafers is thinned. This is illustrated in FIG. 2C, where the backside 211 of substrate 210 of first wafer 201 has been thinned. Any suitable process may be employed to thin the backside 211 of first wafer 201, including chemical-mechanical polishing (CMP), grinding, or etching. In one embodiment, the substrate 210 has an initial thickness of between approximately 500 µm and 800 µm, and the substrate is thinned to a final thickness of between approximately 15 µm and 50 µm.

Figure 2D:
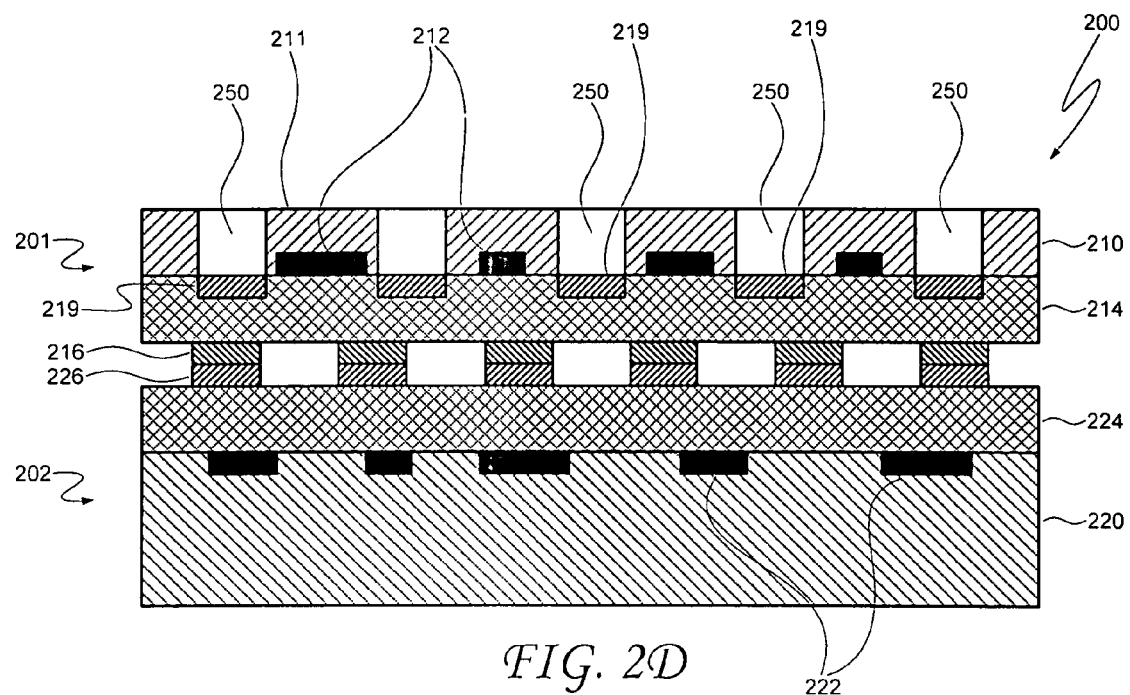

Referring to block 300 in FIG. 1, backside vias are formed by laser ablation. This is illustrated in FIG. 2D, which shows vias 250 that have been formed in the first wafer 201. Each of the vias 250 extends from the backside 211 of first wafer 201 and down through substrate 210 to one of the conductors 219 in the interconnect structure 214 of first wafer 201. The vias 250 will ultimately be filled with a conductive material and will be used to form backside connections for each of the die 205.

Figure 3:
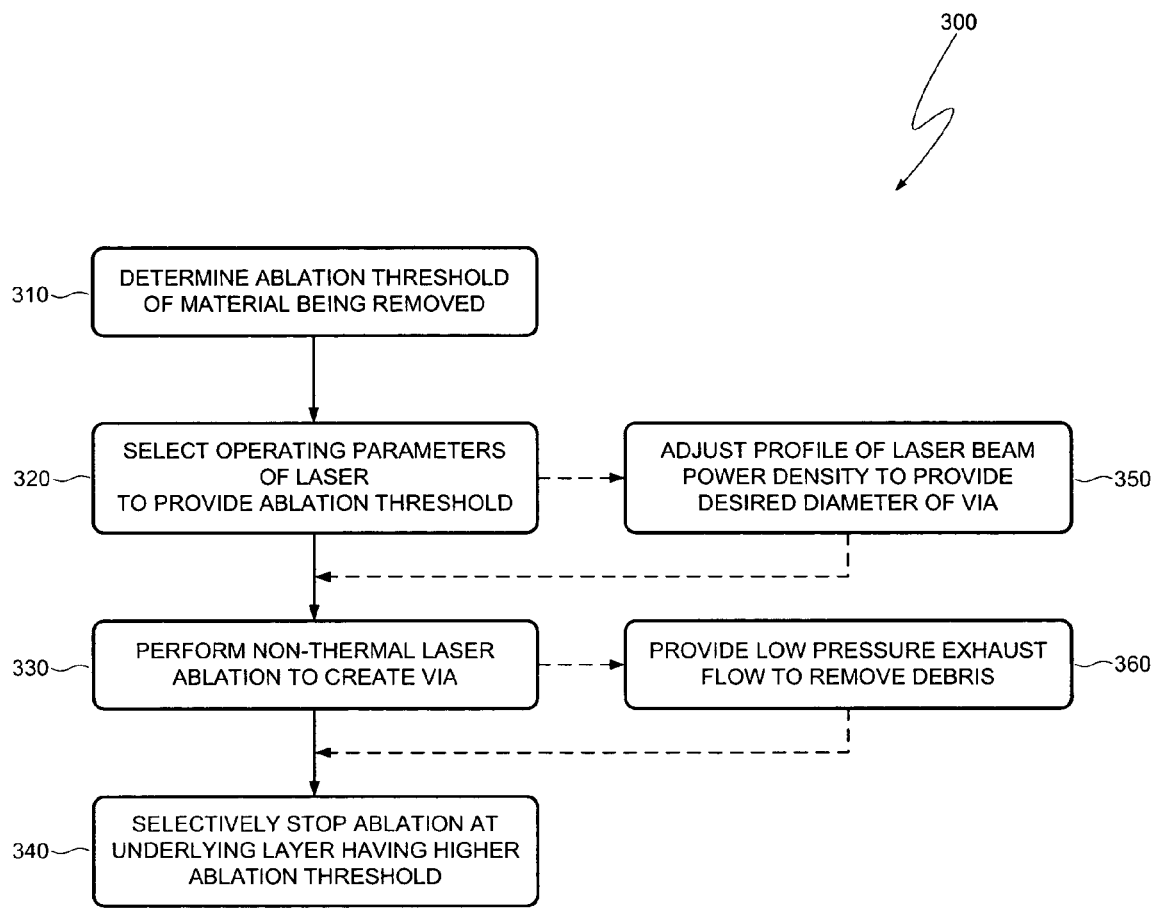
FIG. 3 is a block diagram illustrating an embodiment of a method of forming vias using laser ablation.

Turning to FIG. 3, illustrated is an embodiment of a method 300 of forming a via by laser ablation. It should be understood that the process illustrated in FIG. 3 assumes, in one embodiment, the creation of a single via at a time using a single laser beam, and this process would be repeated for each via that is to be formed. However, the simultaneous formation of multiple vias is within the scope of the disclosed embodiments. For example, according to another embodiment, multiple vias may be formed during the same processing time window by using multiple laser beams. These multiple laser beams may be provided by a number of discrete lasers or by splitting the beam of a single laser into multiple beams.

Referring to block 310 in FIG. 3, the ablation threshold of the material being removed (e.g., Silicon) is determined. The ablation threshold of a material is an energy density level that is sufficient to break chemical bonds within the material, such that non-thermal ablation is the predominant mode of material removal (e.g., minimal to no melting occurs). The ablation threshold may be a function of the laser pulse duration and the laser wavelength, as well as the properties (e.g., band-gap, etc.) of the material being removed. In one embodiment, the pulse duration is in the femtosecond ($10^{-15}$ seconds) range, which range may encompass approximately 1000 femtoseconds, or less, according to one embodiment. For example, for Silicon, the ablation threshold may be achieved with an 800 nm wavelength laser (e.g., a Ti-Sapphire laser) by operating the laser at a pulse width of between approximately 50 and 200 femtoseconds. The number of pulses needed to form a via will be dependent upon the volume of material that is to be removed (e.g., the depth of the via). Continuing with the example above, for a via depth of 20 µm and a via diameter of 5 µm in a Silicon substrate, approximately 500 pulses would be needed to form the via. It should be understood, however, that the above examples represent but one example of process conditions under which the ablation threshold of a material can be reached and, further, that the process conditions at which the ablation threshold can be achieved will vary with the material (or materials) being removed, as well as with the characteristics (e.g., wavelength) of the laser.

As set forth in block 320, the operating parameters of the laser are selected to provide an energy density level that is greater than (or at least substantially equal to) the ablation threshold of the material to be removed (e.g., Silicon). Again, any one or more of the pulse width and wavelength, as well as other factors, may be selected and/or varied to achieve the ablation threshold. Non-thermal laser ablation can then be performed to form a via 250, which is set forth in block 330.

Referring to block 340, in one embodiment, laser ablation selectively stops at an underlying material layer having a higher ablation threshold. For example, the conductors 219 in the interconnect structure 214 of first wafer 201 may comprise Copper, which has a higher ablation threshold than Silicon. If the ablation threshold of the laser is selected such that it exceeds the ablation threshold of Silicon but is less than that of Copper, ablation—and, hence, via formation—will stop at the conductors 219. The conductors 219 will, therefore, function as a natural stop (e.g., in a manner similar to an etch stop). Many ILD materials, such as $SiO_2$, also have a higher ablation threshold than Silicon, and an ILD layer of the interconnect structure 214 may also function as a stop. Stated another way, the via fabrication process will stop automatically once the underlying layer (having a higher ablation threshold) is reached, and the process may therefore be self-selective. Such selectivity can help to account for variations in thickness of the thinned wafer 201.

Figure 4A:
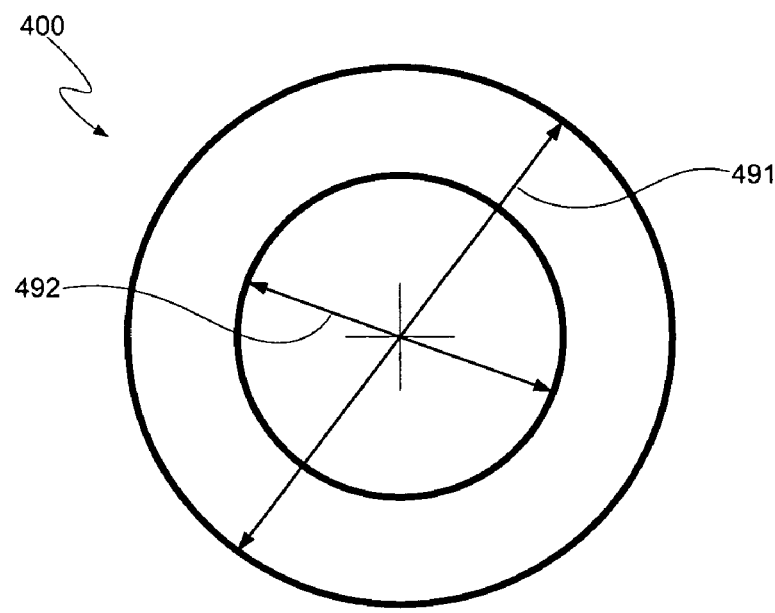
FIG. 4A is a schematic diagram illustrating the profile an exemplary laser beam.
Figure 4B:
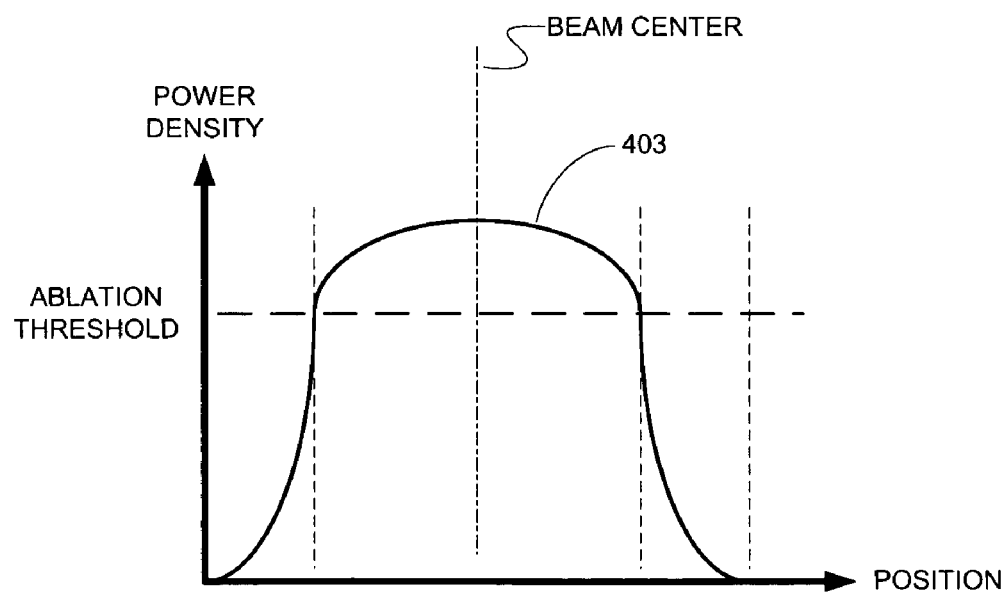
FIG. 4B is a schematic diagram illustrating the power density distribution of the laser beam of FIG. 4A.

In another embodiment, as set forth in block 350, the profile of the laser beam power density is adjusted to provide a desired via diameter. This is further illustrated in FIGS. 4A and 4B. Illustrated in FIG. 4A is a schematic diagram of a laser beam 400, whereas the power density distribution 403 of the laser beam 400 is shown in FIG. 4B. The laser beam has an outer diameter 491. At some smaller diameter 492, the power density is sufficient to achieve the ablation threshold; however, at regions of the laser beam 400 that lie outside the diameter 492—e.g., that region which lies between the outer and inner diameters 491, 492—the power density is insufficient to achieve the ablation threshold (see FIG. 4B). Thus, the diameter of the via formed by the laser beam 400 will substantially correspond to the inner diameter 492 at which the power density is sufficient to reach or exceed the ablation threshold. Accordingly, a via having a diameter smaller that the outer diameter of the laser beam can be formed. By adjusting the profile of the laser beam power density, a desired diameter via can be formed.

In a further embodiment, as set forth in block 360, a low pressure exhaust flow is introduced into the processing chamber (in which via formation is taking place), and this low pressure exhaust flow can aid in removing debris generated by via formation. Non-thermal laser ablation can be a direct solid-to-plasma process, and the generated debris may be non-sticky and powder-like, making this debris amenable to removal by a low pressure exhaust flow.

Figure 2E:
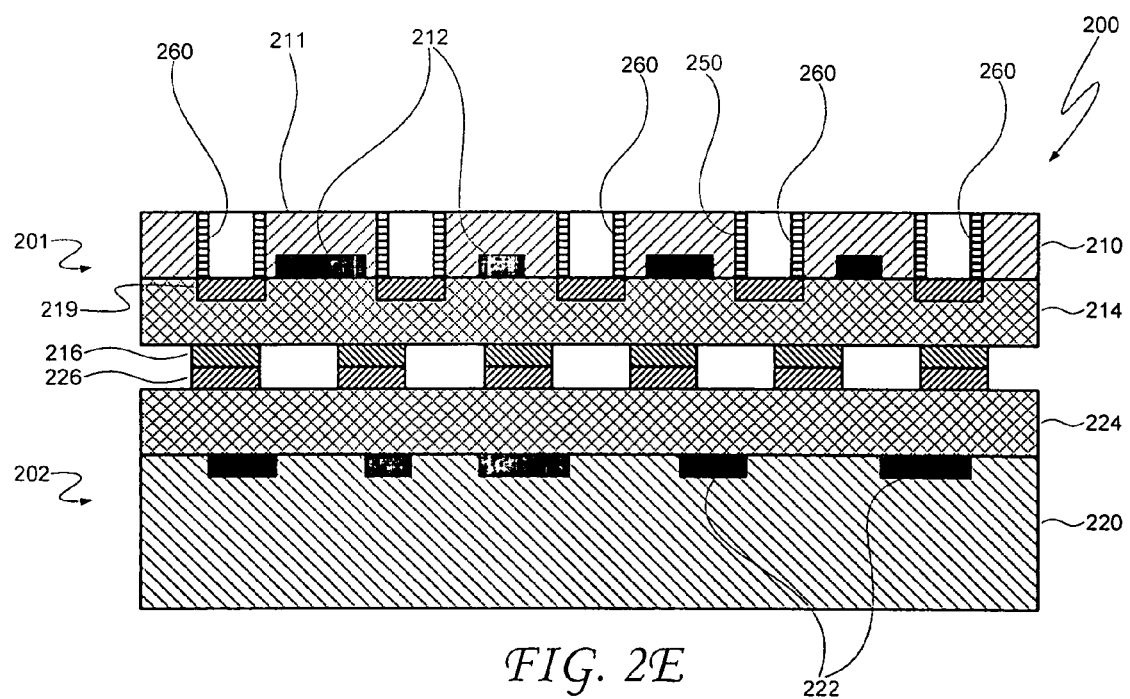

Returning again to FIG. 1, after via formation, a layer of a barrier material may be deposited over the walls of the vias, as set forth in block 130. This is illustrated in FIG. 2E, where a barrier layer 260 has been deposited within the vias 250. The barrier layer 260 is disposed over the walls of the vias, but does not overly the underlying conductors 219. The vias 250 will ultimately be filled with a conductive material, and the barrier layer 260 can serve to electrically isolate the conductive material and can also prevent diffusion of the conductive material into the surrounding ILD material. The barrier layer may comprise, for example, $Si_3N_4$, or any other suitable material. Any suitable process, such as chemical vapor deposition (CVD) or physical vapor deposition (PVD), may be used to deposit the barrier layer material. After deposition of the barrier layer, a planarization process (e.g., CMP) may be performed to remove excess barrier material from the backside 211 of first wafer 201.

Figure 2F:
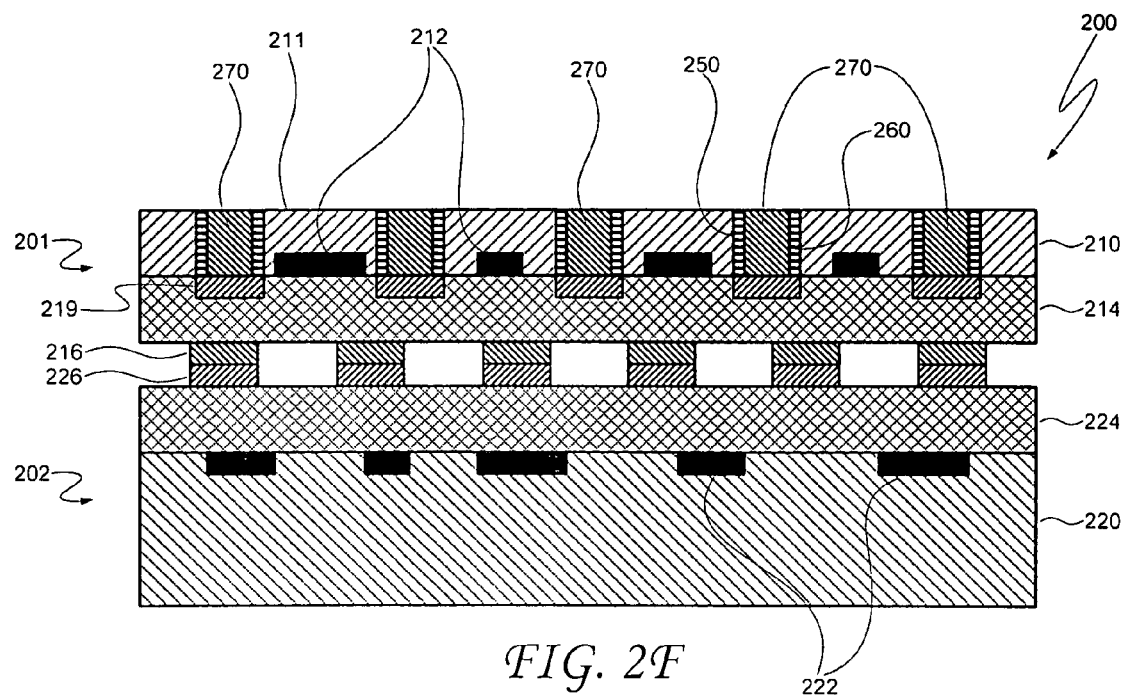

Referring to block 140, a conductive material is deposited in the vias. This is illustrated in FIG. 2F, where a conductive material 270 has been deposited within each via 250 and over the barrier layer 260. Generally, the conductive material 270 within each via 250 will extend from the backside 211 of the first wafer 201 down to the underlying conductor 219 in the wafer's interconnect structure 214, wherein electrical communication is established between the conductive material 270 and conductor 219. The conductive material 270 may comprise any suitable conductor, such as Copper, Aluminum, Silver, Gold, as well as alloys of these metals (or other materials). Further, any suitable process may be employed to deposit the conductive material 270, including CVD, PVD, electroplating, or electroless plating. After deposition of the conductive material 270, a planarization process (e.g., CMP) may be performed to remove excess conductive material from the backside 211 of first wafer 201.

Figure 2G:
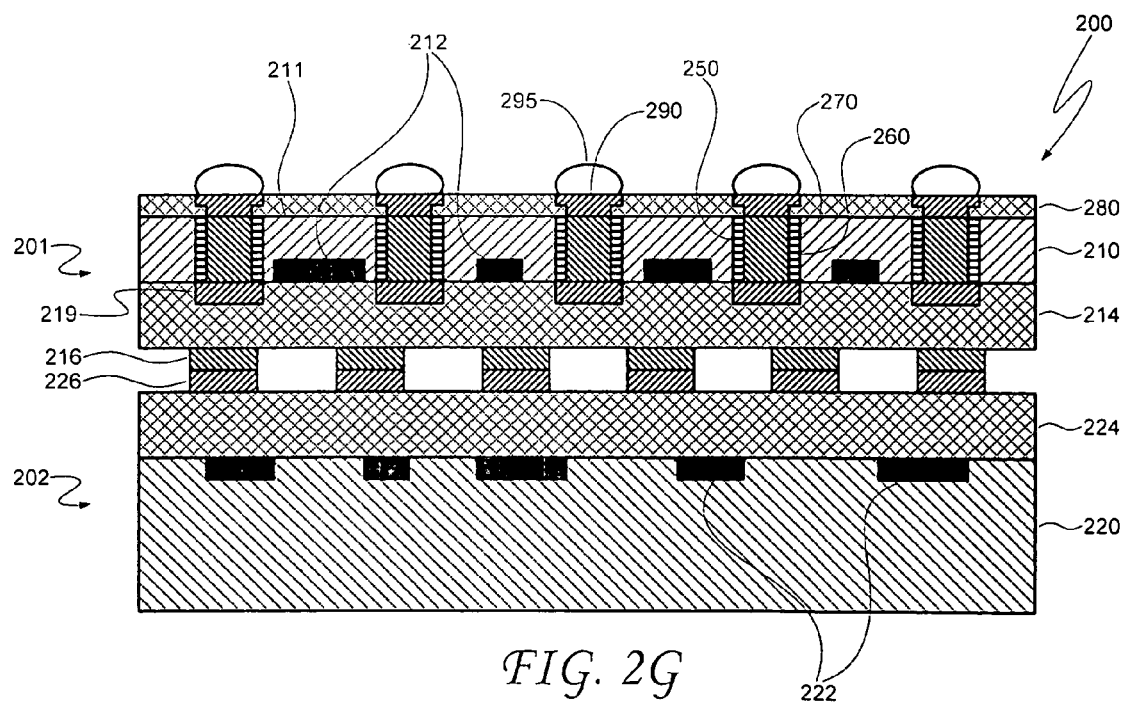

As set forth in block 150, leads can then be formed at the backside of the wafer. This is illustrated in FIG. 2G, which shows a dielectric layer 280 that has been disposed over the first wafer's backside 211, and conductive bond pads 290 have been formed in this dielectric layer 280. Conductive bumps 295 (e.g., solder) or other suitable leads have been deposited on the bond pads 290, and these leads 295 can be used to couple each stacked die 205 (after singulation) with a next-level component.

In a further embodiment, after via formation, a cleaning process may be performed, as set forth in block 160. For example, the wafer stack 200 may be cleaned in a solution of water and hydrofluoric acid (HF). This cleaning step may remove any debris generated during the laser ablation process (and not removed by exhaust, as set forth in block 360 of FIG. 3).

At this juncture, it should be noted that, in some instances, "dummy" vias may be formed in first wafer 201. Dummy vias, which will not be used to form backside electrical connections, are often formed at various selected locations in order to maintain process uniformity, and numerous dummy vias may be distributed across the first wafer 201. Thus, it should be understood that, ultimately, not all of the vias 250 are necessarily utilized for establishing backside electrical connections. It should also be noted that substrate 210 of first wafer 201 was previously thinned, and the vias 250 are formed through this thinned substrate; however, in another embodiment, vias are formed in a wafer that has not been thinned.

It should also be noted that, in FIGS. 2A through 2G, only a limited number of active devices 212, 222, vias 250 (with conductive material 270), conductors 219, and conductors 216, 226, are shown for ease of illustration and clarity. However, as the reader will appreciate, the integrated circuitry formed on wafers 201, 202 for each stacked die 205 may, in practice, include tens of millions, or even hundreds of millions, of active devices 212, 222 (e.g., transistors) and, further, that the interconnect structure 214 may include several hundred of the conductors 219. Similarly, it will be appreciated that each stacked die 205 to be formed from wafers 201, 202 may, in practice, include hundreds of backside connections (e.g., conductive filled vias 250, bond pads 290, and leads 295). Thus, it should be understood that FIGS. 2A through 2G are simplified schematic representations of the wafer stack 200 presented merely as an aid to understanding the disclosed embodiments and, further, that no unnecessary limitations should be drawn from these schematic representations.

Embodiments of a method of forming backside connections on a wafer stack, as well as embodiments of a method of forming backside vias by non-thermal laser ablation, having been described above, the reader will appreciate the advantages of the disclosed embodiments. The non-thermal laser ablation process produces little to no melting, which minimized thermal damage and enables the formation of vias having a uniform shape and minimal distortion. By appropriate selection of the ablation threshold (and materials), an underlying material layer can serve as a natural stop for via formation, and this selectivity can minimize the sensitivity to thickness variations of a thinned wafer. Also, the laser beam's power density profile can be adjusted to achieve a desired via diameter that is smaller than the outer diameter of the laser beam. Also, minimal debris is generated by the laser ablation process, and this debris can be readily removed by a low pressure exhaust flow and/or a cleaning process.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method of forming a backside connection on a wafer stack, comprising:
   bonding a first wafer to a second wafer to form a wafer stack, each of the first and second wafers including integrated circuitry for a number of die;
   thinning a backside of the first wafer of the stack;
   directing a laser beam at the backside of the first wafer to create a via in the first wafer, the via formed by substantially non-thermal ablation of the first wafer material, wherein one end of the via opens to the backside of the first wafer and an opposing end of the via extends down to a conductive layer in an interconnect structure of the first wafer;
   forming a backside connection at the via, the backside connection including a conductive lead; and
   cutting the wafer stack into the number of die, one of the die including the conductive lead.

2. The method of claim 1, wherein the laser beam has a pulse duration less than approximately 1000 femtoseconds.

3. The method of claim 2, wherein the laser beam has a pulse duration between approximately 50 and 200 femtoseconds.

4. The method of claim 1, wherein the laser has a wavelength of approximately 800 nm.

5. The method of claim 1, wherein the conductive layer material has an ablation threshold that is greater than an ablation threshold of the first wafer material, and the conductive layer functions as a stop.

6. The method of claim 1, wherein the first wafer material comprises silicon.

7. The method of claim 1, wherein forming a backside connection at the via comprises:
   depositing a barrier layer over a wall of the via;
   depositing a conductive material within the via; and
   forming the conductive lead at the first wafer backside, the conductive lead in electrical communication with the conductive material in the via.

* * * * *